United States Patent [19]
Yang

[11] Patent Number: 5,930,648
[45] Date of Patent: Jul. 27, 1999

[54] SEMICONDUCTOR MEMORY DEVICE HAVING DIFFERENT SUBSTRATE THICKNESS BETWEEN MEMORY CELL AREA AND PERIPHERAL AREA AND MANUFACTURING METHOD THEREOF

[75] Inventor: Ji Woon Yang, Kyoungki-do, Rep. of Korea

[73] Assignee: Hyundai Electronics Industries Co., Ltd., Ichon-shi, Rep. of Korea

[21] Appl. No.: 08/997,064

[22] Filed: Dec. 23, 1997

[30] Foreign Application Priority Data

Dec. 30, 1996 [KR] Rep. of Korea ................ 96-76273

[51] Int. Cl.[6] .................................................. H01L 21/70
[52] U.S. Cl. ......................... 438/443; 438/253; 257/391
[58] Field of Search .................................. 438/253

[56] References Cited

U.S. PATENT DOCUMENTS 5,250,456 10/1993 Bryant ........................... 438/253
5,455,438 10/1995 Hashimoto et al. ............ 257/391
5,496,758 3/1996 Ema ............................... 438/253
5,677,223 10/1997 Tseng ............................. 438/253
5,780,333 7/1998 Kim ............................... 438/253

*Primary Examiner*—Charles Bowers
*Assistant Examiner*—David S Blum
*Attorney, Agent, or Firm*—Jacobson, Price, Holman & Stern, PLLC

[57] ABSTRACT

A semiconductor memory device is provided with a semiconductor substrate having a lower semiconductor layer, an upper semiconductor layer and a buried insulation layer interposed therebetween. wherein the upper semiconductor layer has a first and a second regions and a thickness of the first region is smaller than that of the second region; a memory cell area including a plurality of memory cell elements formed on the first region; and a peripheral circuit area including a plurality of peripheral circuit elements formed on the second region.

6 Claims, 3 Drawing Sheets

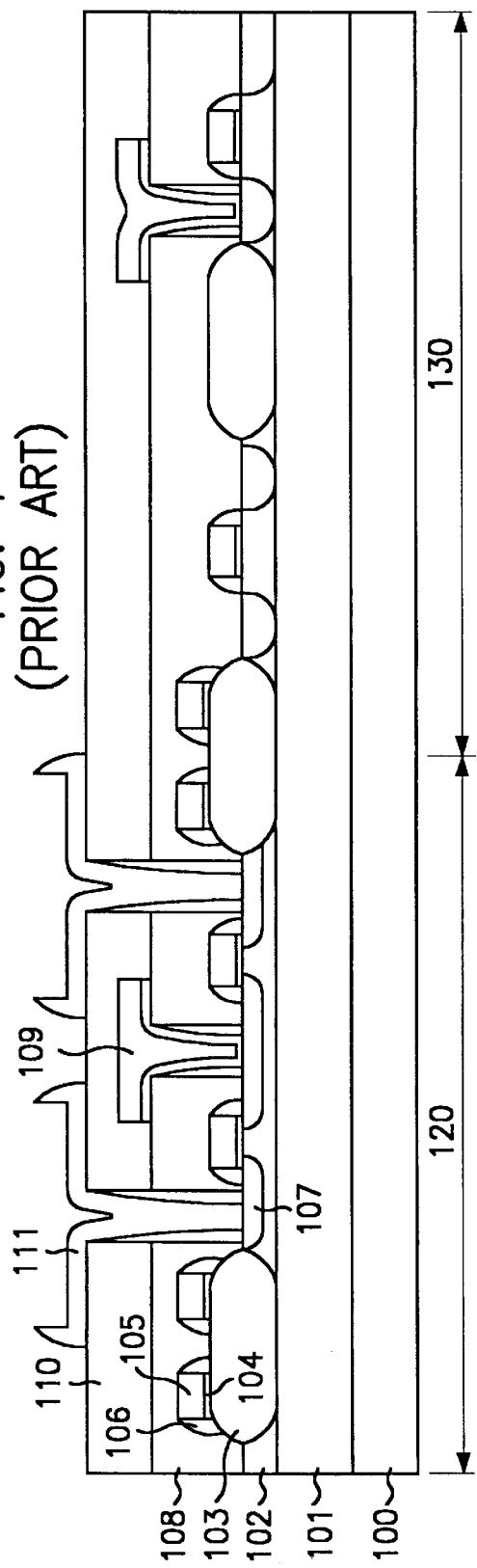
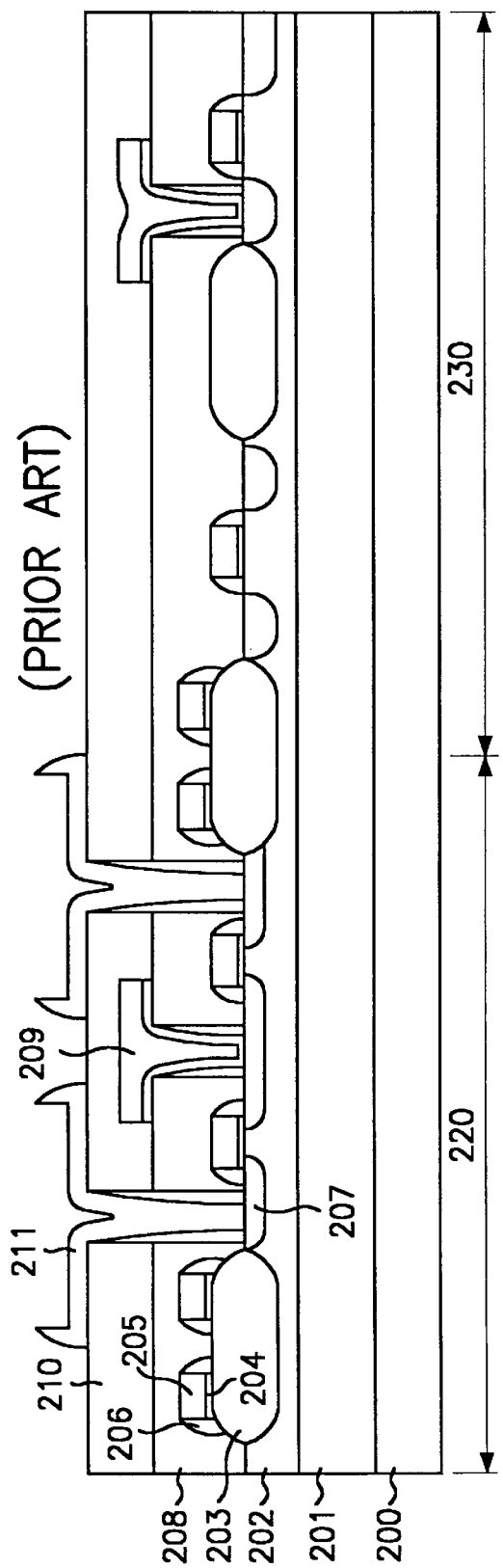

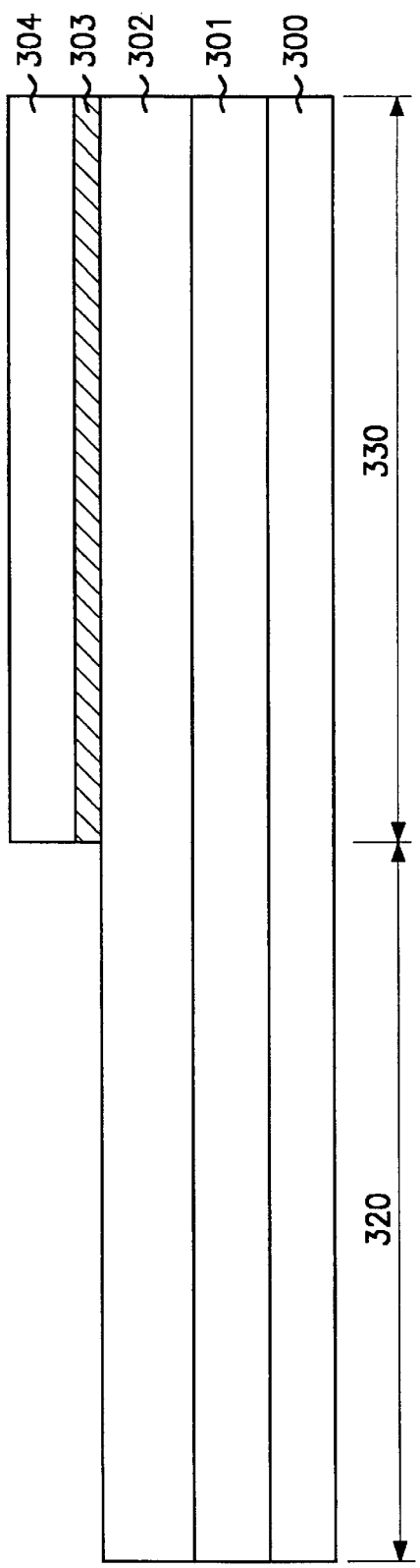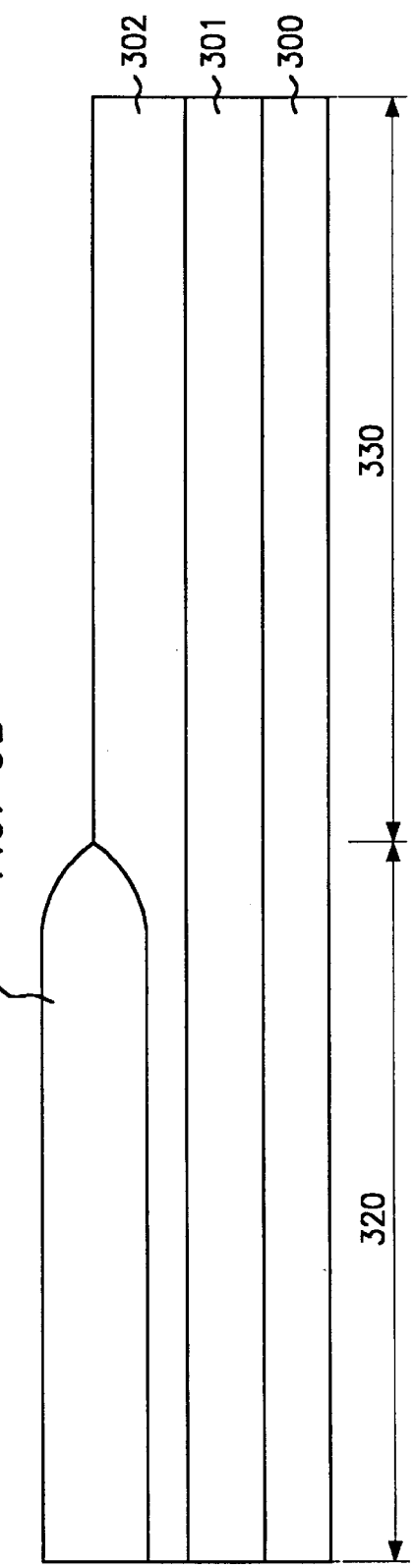

SEMICONDUCTOR MEMORY DEVICE HAVING DIFFERENT SUBSTRATE THICKNESS BETWEEN MEMORY CELL AREA AND PERIPHERAL AREA AND MANUFACTURING METHOD THEREOF

FIELD OF THE INVENTION

The present invention relates to a semiconductor memory device and, more specifically, to a semiconductor memory device having a silicon on insulator(SOI) substrate and manufacturing method thereof.

DESCRIPTION OF THE PRIOR ART

It has been generally required that a semiconductor memory device, such as a dynamic random access memory (DRAM), has a highly integrated structure, a high operational speed, and a low power consumption. In order to obtain such a semiconductor memory device having the above characteristics, various techniques have been studied and developed. One of those techniques provides a semiconductor memory device having MOS transistors formed on a silicon on insulator(SOI) substrate which includes three layers: a lower silicon substrate, a buried oxide layer, and an upper silicon layer.

Referring to FIG. 1, there is shown a conventional semiconductor memory device having the SOI substrate which includes a lower silicon substrate 100, a buried oxide layer 101 and an upper silicon layer 102.

The semiconductor memory device can be defined as two regions: a memory cell region 120 and a peripheral region 130: and is provided with a field oxide layer 103, a gate insulating layer 104, gate electrodes 205, a spacer insulating layer 106, sources/drains 107, insulating layers 108 and 110, bit lines 109 and charge storage electrodes 111.

MOS transistors formed on the SOI substrate have a lower junction capacitance than that of the conventional MOS transistors formed on a single crystal silicon substrate to thereby allow the semiconductor memory device to have an improved operational speed and a reduced power consumption. Further, a more complete isolation structure can be provided in the semiconductor memory device through the use of the buried oxide layer and the field oxide layer so that a latch-up effect lowering an electrical characteristic thereof and a punch-through developed between active regions are effectively reduced. Furthermore, additional steps for forming isolation wells can be eliminated from the fabrication processes thereof to thereby enhance the manufacturing productivity thereof.

However, as shown, the thickness of the upper silicon layer 102 is considerably small to make a body including the MOS transistors float on the substrate. As a result, problems such as a parasitic BJT effect and a kink effect, which may severely affect the performance of the semiconductor memory device, can be developed thereon.

In order to suppress the above problems, another method has been proposed and, referring to FIG. 2, there is illustrated a semiconductor memory device having a so called "body contact" SOI structure. In a similar manner, the SOI substrate has a lower silicon substrate 200, a buried oxide layer 201 and an upper silicon layer 202 which is a greater thickness than that of the upper silicon layer 102 shown in FIG. 1. The semiconductor memory device can be also defined by two regions: a memory cell region 220 and a peripheral region 230; and is provided with a buried oxide layer 201, a field oxide layer 203, a gate insulating layer 204, gate electrodes 205, a spacer insulating layer 206. sources/drains 207, insulating layers 208 and 210, bit lines 209 and charge storage electrodes 211.

As shown, since the thickness of the upper silicon layer 202 is large enough to protect body from floating, the parasitic BJT effect and the kink effect can be effectively reduced. However, there is a problem that, when the low voltage is applied to the semiconductor memory device, the junction capacitance thereof is greater than that of the semiconductor memory device having a conventional SOI structure so that the operational speed thereof can be considerably reduced.

SUMMARY OF THE INVENTION

It is, therefore, a primary object of the invention to provide a semiconductor memory device having an SOI structure and a manufacturing method thereof which are capable of effectively maintaining an appropriate junction capacitance to thereby not only improve the operation speed thereof but also suppress the parasitic BJT and the kink effects.

In accordance with one aspect of the present invention, there is provided a semiconductor memory device comprising: a semiconductor substrate having a lower semiconductor layer, an upper semiconductor layer and a buried insulation layer interposed therebetween, wherein the upper semiconductor layer has a first and a second regions and a thickness of the first region is smaller than that of the second region; a memory cell area including a plurality of memory cell elements formed on the first region; and a peripheral circuit area including a plurality of peripheral circuit elements formed on the second region.

In accordance with another aspect of the present invention, there is provided a method for preparing a semiconductor device, comprising the steps of: a) forming a semiconductor substrate; b) forming an oxide protection layer over a predetermined portion of the semiconductor substrate; c) forming a thermal oxide layer on the other portion of the semiconductor substrate; d) sequentially eliminating the oxide protection layer and the heated oxide layer to thereby allowing the semiconductor substrate having a first and a second regions, wherein the thickness of the first region is smaller than that of the second region; and e) forming the memory cell area including a plurality of memory cell elements formed on the first region and the peripheral circuit area including a plurality of peripheral circuit elements formed on the second region.

BRIEF DESCRIPTION OF THE DRAWINGS

The above and other objects and features of the present invention will become apparent from the following description of preferred embodiments given in conjunction with the accompanying drawing, in which:

FIG. 1 shows a sectional view of a conventional dynamic random access memory(DRAM) having a silicon on insulator(SOI)structure;

FIG. 2 illustrates a sectional view of a conventional DRAM having a body contact SOI structure;

FIGS. 3A to 3C depict sectional views illustrating fabrication process of a DRAM in accordance with the present invention.

DETAILED DESCRIPTION OF THE PREFERRED EMBODIMENTS

Figure 3C:
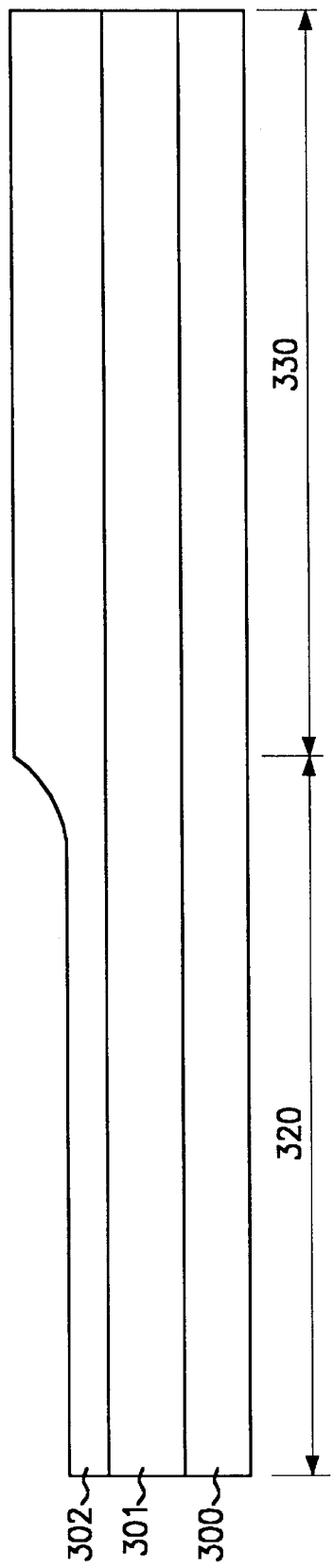

Referring to FIGS. 3A to 3C, there are shown successive steps of a method, in accordance with a preferred embodiment of the present invention, for fabricating the dynamic random access memory (hereinafter, referred as DRAM).

As shown in FIG. 3A, a silicon on insulator (SOI) substrate, which has a lower silicon substrate layer 300, a buried oxide layer 301 and an upper silicon layer 302, is formed by suing a conventional process. A pad oxide layer 303 and a silicon nitride layer 304 are sequentially formed thereon. Thereafter, a portion of the pad oxide layer 303 and the silicon nitride layer 304, which corresponds to a memory cell region 320, is eliminated. That is, the silicon nitride and the pad oxide layers 303 and 304 are partially etched by using a photo resistor pattern (not shown) to form an anti-oxidation pattern. In this case, a thickness of the upper silicon layer 302 should be maintained in the range from 500 Å to 5000 Å.

Referring to FIG. 3B, a thermal oxidation layer 305 is grown on a portion of the upper silicon layer 302 through the use of a thermal oxidation process, wherein the portion corresponds to the memory cell region 320. In this case, the thickness of the thermal oxidation layer 305 is in range from 50 Å to 1000 Å but the silicon layer 302 should not be completely oxided. Thereafter, the silicon nitride layer 304 and the pad oxide layer 303 is then eliminated and then, as shown in FIG. 3C, the thermal oxidation layer is eliminated by using an etching process. As a result, the upper silicon layer has a first and a second regions, wherein the first region corresponds to the memory cell region and has a smaller thickness than that of the second region.

Thereafter, memory cell elements and peripheral circuit elements are formed on the first and the second regions of the upper silicon layer, respectively. Especially, the field oxide layer for isolating each of the memory element is extended to contact it to the buried insulating layer; the field oxide layer for isolating the memory cell region from the peripheral circuit region is extended to contact it to the buried insulating layer; and the field oxide layer for isolating each of the peripheral circuit elements is not extended to the buried insulating layer.

Figure 4:
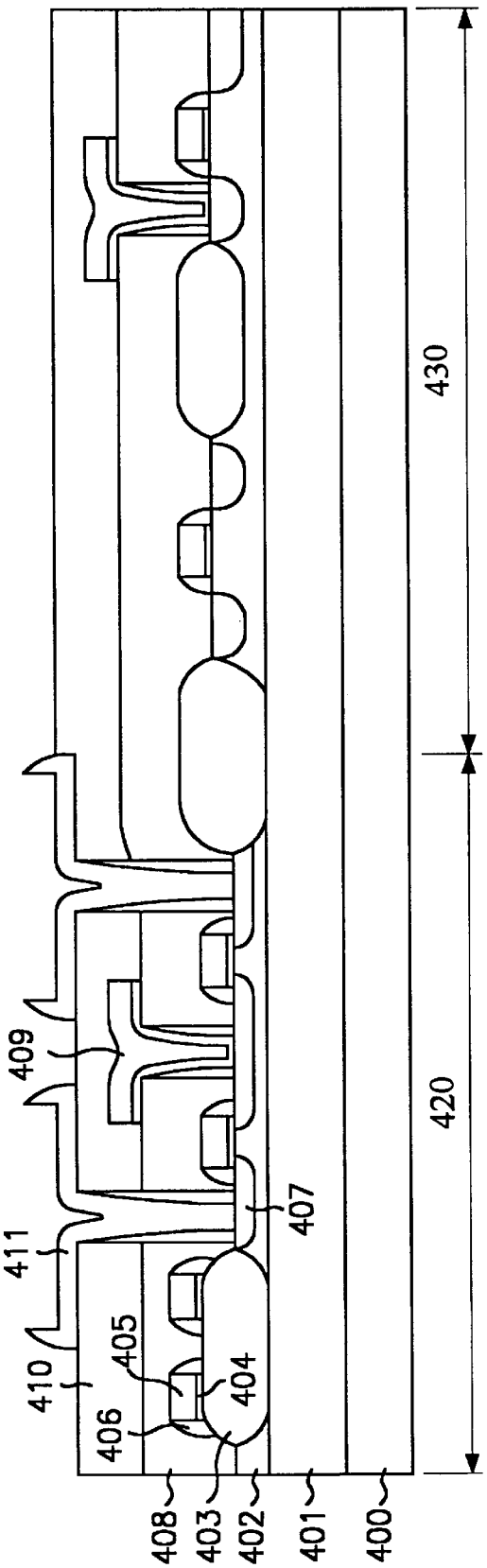
FIG. 4 provides a sectional view of the DRAM prepared in accordance with the present invention.

Referring to FIG. 4, there is shown a sectional view of a DRAM having an improved SOI substrate fabricated by using the method shown in FIGS. 3A to 3C. The DRAM is defined by using a memory cell area 420 and a peripheral circuit area 430; and includes a lower silicon substrate 400, a buried oxide layer 401, an upper silicon layer 402. The DRAM also includes a field oxide layer 403, gate insulators 404, gate electrodes 405, a space insulating layer 406. sources/drains 407, insulating layers 408 and 410, bit lines 409, charge storage electrodes 411 as the memory cell and the peripheral circuit elements.

As can be seen from the above, the DRAM in accordance with the present invention has a conventional SOI structure formed on the memory cell area and a body contact SOI structure formed on the peripheral circuit area to thereby simultaneously obtain a reduced static capacitance of the bit lines and more appropriate operation characteristics of the peripheral circuitry.

While the present invention has been shown and described with reference to the particular embodiments, it will be apparent to those skilled in the art that many changes and modifications may be made without departing from the spirit and scope of the invention as defined in the appended claims.

What is claimed is:

1. A method for preparing a semiconductor device, comprising the steps of:

a) forming a semiconductor substrate;

b) forming an oxide protection layer over a predetermined portion of the semiconductor substrate;

c) forming a thermal oxide layer on the other portion of the semiconductor substrate;

d) sequentially eliminating the oxide protection layer and the heated oxide layer to thereby allowing the semiconductor substrate having a first and a second regions, wherein the thickness of the first region is smaller than that of the second region; and e) forming the memory cell area including a plurality of memory cell elements formed on the first region and the peripheral circuit area including a plurality of peripheral circuit elements formed on the second region and forming field isolation insulating films including first field oxide layers for isolating the memory cell elements from the peripheral circuit elements, second field oxide layers for isolating the memory cell elements from each other and third field oxide layers for isolating the peripheral circuit elements from each other;

wherein the first field oxide layers are formed between the memory cell area and the peripheral circuit area and extended to the buried insulation layer; the second field oxide layers are extended to the buried insulation layer; and the third field oxide layers are not extended to the buried insulation layer.

2. The method as recited in claim 4, wherein the step a) includes the steps of forming a lower semiconductor layer, an upper semiconductor layer and a buried insulation layer interposed therebetween.

3. The method as recited in claim 1, wherein the oxide protection layer includes sequentially deposited pad oxide and silicon nitride layers.

4. The method as recited in claim 2, wherein the thickness of the upper semiconductor layer is in a range from 500 Å to 5000 Å.

5. The method as recited in claim 1, wherein the thickness of the thermal oxide layer is in a range from 50 Å to 1000 Å.

6. The method as recited in claim 1, wherein the difference between the thickness of the first and the second regions is in a range from 50 Å to 1000 Å.

* * * * *